United States Patent
Kim et al.

(10) Patent No.: US 10,980,156 B2
(45) Date of Patent: Apr. 13, 2021

(54) INDUCTION HEATING DEVICE HAVING IMPROVED COOLING STRUCTURE

(71) Applicant: LG Electronics Inc., Seoul (KR)

(72) Inventors: Seongjun Kim, Seoul (KR); Seongho Son, Seoul (KR); Yongsoo Lee, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 16/678,767

(22) Filed: Nov. 8, 2019

(65) Prior Publication Data
US 2020/0154598 A1    May 14, 2020

(30) Foreign Application Priority Data

Nov. 8, 2018  (KR) .................. 10-2018-0136322

(51) Int. Cl.
*H05K 7/20* (2006.01)
*H05B 6/06* (2006.01)
(Continued)

(52) U.S. Cl.
CPC ............ *H05K 7/207* (2013.01); *H05B 6/06* (2013.01); *H05B 6/42* (2013.01); *H05K 5/0204* (2013.01); *H05K 7/209* (2013.01)

(58) Field of Classification Search
CPC ....... H01L 2224/32225; H01L 2224/97; H01L 2924/3025; H05B 6/1263; H05B 45/37;
(Continued)

(56) References Cited

U.S. PATENT DOCUMENTS

2007/0278215 A1* 12/2007 Schilling .............. H05B 6/1263
                                                              219/622
2008/0185376 A1*  8/2008 Gagas ................. H05B 6/1263
                                                              219/623
(Continued)

FOREIGN PATENT DOCUMENTS

DE    112013004163         5/2015
EP       3334248           6/2018
(Continued)

OTHER PUBLICATIONS

Extended European Search Report in European Application No. 19204555.7, dated Apr. 1, 2020, 12 pages.

*Primary Examiner* — Adam B Dravininkas
(74) *Attorney, Agent, or Firm* — Fish & Richardson P.C.

(57) ABSTRACT

An induction heating device includes a case having a lower plate that defines an inlet and an exhaust slit; a cover plate coupled to the case; a working coil disposed inside the case; an indicator substrate support coupled to the lower plate and disposed below the working coil; an inverter substrate disposed on a lower surface of the indicator substrate support and including an inverter and a first heat sink configured to dissipate heat generated from the inverter; and a first blowing fan disposed at the lower plate and configured to draw air from an outside of the case through the inlet and discharge the air to the inverter substrate. The exhaust slit is configured to discharge, to an area below the lower plate, at least a portion of air discharged from the first blowing fan to the inverter substrate.

20 Claims, 14 Drawing Sheets

(51) Int. Cl.
*H05K 5/02* (2006.01)
*H05B 6/42* (2006.01)

(58) Field of Classification Search
CPC ...... H05B 45/00; H05B 45/395; H05B 45/50; H05B 2206/022; H05B 47/155; H05B 6/108; H05B 6/062; H05B 6/42; H05B 6/1209; H05B 47/19; H05B 6/06; H05B 47/105; H05B 6/145; H05B 2213/07; H05B 45/10; H05K 7/20809; H05K 1/181; H05K 7/20909; H05K 1/0203; H05K 7/20145; H05K 7/20209; H05K 9/0081

See application file for complete search history.

(56) References Cited

U.S. PATENT DOCUMENTS

| | | | |
|---|---|---|---|
| 2010/0163549 A1* | 7/2010 | Gagas | F24C 15/2042 219/622 |
| 2010/0187222 A1 | 7/2010 | Kim et al. | |
| 2010/0200557 A1* | 8/2010 | Son | F24C 15/101 219/209 |
| 2012/0152933 A1* | 6/2012 | Matsui | H05B 6/1263 219/623 |
| 2012/0305544 A1* | 12/2012 | Oagley | H05B 6/1263 219/622 |
| 2014/0014649 A1* | 1/2014 | Chavan | F24C 15/101 219/620 |
| 2016/0150597 A1* | 5/2016 | Yun | H05B 6/065 219/624 |
| 2016/0262217 A1* | 9/2016 | Pastore | H05B 6/42 |
| 2016/0323937 A1 | 11/2016 | Anton Falcon et al. | |
| 2017/0019959 A1* | 1/2017 | Park | H05B 6/1209 |
| 2017/0257913 A1* | 9/2017 | Vengroff | H05B 6/1209 |
| 2019/0306931 A1 | 10/2019 | Malkomes et al. | |
| 2020/0041136 A1* | 2/2020 | Christensen Phillips | F24C 15/101 |

FOREIGN PATENT DOCUMENTS

| | | |
|---|---|---|
| KR | 20180026141 | 3/2018 |
| WO | WO2008103009 | 8/2008 |

\* cited by examiner

LDF: FF, RF, LSF, RSF

INDUCTION HEATING DEVICE HAVING IMPROVED COOLING STRUCTURE

CROSS-REFERENCE TO RELATED APPLICATION

The present disclosure claims priority to and the benefit of Korean Patent Application No. 10-2018-0136322, filed on Nov. 8, 2018, the disclosure of which is incorporated herein by reference in its entirety.

TECHNICAL FIELD

The present application relates to an induction heating device having an improved cooling structure.

BACKGROUND

Various types of cooking appliances may be used to heat food in homes and restaurants. For example, gas ranges may use gas as fuel. In some examples, cooking devices may heat an object such as a cooking vessel (e.g., a pot) with electricity instead of gas.

A method of heating an object via electricity may be classified into a resistive heating method and an induction heating method. In the electrical resistive method, heat may be generated based on current flowing through a metal resistance wire or a non-metallic heating element, such as silicon carbide, and the heat may be transmitted to the object through radiation or conduction. In the induction heating method, eddy current may be generated in the object made of metal based on a magnetic field generated around a coil based on a high-frequency power having a predetermined magnitude applied to the coil to heat the object.

Induction heating devices that use an induction heating method may include working coils arranged respectively in corresponding regions to heat each of a plurality of objects.

In some cases, an induction heating device (e.g., a zone-free type induction heating device) may simultaneously heat one object with a plurality of working coils.

In some cases, a zone-free type induction heating device may inductively heat an object regardless of a size and a position of the object that is disposed in a region in which a plurality of working coils are present.

In some cases, the zone-free type induction heating device (e.g., a flex or dual type induction heating device) may have a cooling structure (e.g., a blowing fan) to control the temperature of the components related to the driving the working coil. One example of the cooling structure of an induction heating device in related art is described with reference to FIG. 1.

FIG. 1 is a schematic view showing a cooling structure of an induction heating device in related art.

Referring to FIG. 1, an induction heating device may include a blowing fan 20 and a fan cover 50 in an inside of a case 10 to reduce heat (i.e., a temperature) of a printed circuit board (PCB) 30 for controlling the driving of the working coil or the indicator. An exhaust slit 15 is defined at one side of the case 10, and the exhaust slit 15 is placed opposite to the blowing fan 20 with respect to the fan cover 50.

The temperature of the PCB 30 may be reduced by the air discharged by the blowing fan 20 while passing through a heat sink 40 along an air flow path defined by the fan cover 50. The air (i.e., the heat) that has passed through the heat sink 40 may be discharged to an outside of the case 10.

The fan cover 50 may prevent the heat discharged by the heat sink 40 from being leaking to other components or a substrate, and may function as an air flow path to guide the heat discharged from the heat sink 40.

In some cases, where an additional injection component such as the fan cover 50 is included in a cooling structure, material cost of the induction heating device may increase. In some examples, the injection component may require an additional mold to be manufactured, thereby incurring additional cost to manufacture the mold.

In some cases, the cooling structure described above may increase a height of the product (i.e., a height of the induction heating device) due to the fan cover 50, thereby making it difficult to manufacture a compact product.

The height of the product may be an important factor to determine whether another product may be installed at a lower end of the product. If the height of the product (i.e., a size of the product) can be reduced, another product may be installed at the lower end of the product.

SUMMARY

The present disclosure provides an induction heating device capable of controlling a temperature of an inverter substrate and a resonance substrate.

The present disclosure further provides an induction heating device capable of controlling a temperature of a working coil and an indicator.

The objects of the present disclosure are not limited to the above-mentioned objects, and other objects and advantages of the present disclosure which are not mentioned may be understood by the following description and more clearly understood by the implementations of the present disclosure. It will also be readily apparent that the objects and advantages of the present disclosure may be implemented by means defined in claims and a combination thereof.

According to one aspect of the subject matter described in this application, an induction heating device includes: a case including a lower plate and a side plate that extends upward along an edge of the lower plate, where the lower plate defines an inlet and an exhaust slit; a cover plate coupled to the side plate and configured to seat an object on an upper surface of the cover plate; a working coil disposed inside the case and configured to heat the object; an indicator substrate support coupled to the lower plate and disposed vertically below the working coil; an inverter substrate that is disposed on a lower surface of the indicator substrate support and that includes (i) an inverter configured to apply a resonance current to the working coil through a switching operation and (ii) a first heat sink configured to dissipate heat generated from the inverter; and a first blowing fan disposed at the lower plate and configured to draw air from an outside of the case through the inlet and discharge the air to the inverter substrate. The exhaust slit is configured to discharge, to an area below the lower plate, at least a portion of air discharged from the first blowing fan to the inverter substrate.

Implementations according to this aspect may include one or more of the following features. For example, the indicator substrate support may include: a lower fence disposed on the lower surface of the indicator substrate support, the lower fence including a front fence, a rear fence, a first side fence, and a second side fence that are arranged along an edge of the lower surface of the indicator substrate support; and a supporting guide disposed on the lower surface of the indicator substrate support and spaced apart from the first side fence. The inverter substrate may be disposed between the first side fence and the supporting guide.

In some examples, each of the front fence, the first side fence, and the second side fence may extend downward from the lower surface of the indicator substrate support and defines a right angle with respect to the lower surface of the indicator substrate support. The rear fence may include: a first portion that extends from the lower surface of the indicator substrate support and that defines an obtuse angle with respect to the lower surface of the indicator substrate support; and a second portion that extends downward from the lower surface of the indicator substrate support and that defines the right angle with respect to the lower surface of the indicator substrate support.

In some implementations, the induction heating device may further include an input interface that is flush with an upper surface of the cover plate and that is configured to display one or more images, where the second portion of the rear fence extends downward from the lower surface of the indicator substrate support along an edge of the input interface. In some examples, the rear fence may be configured to: receive a first portion of air that is discharged from the first blowing fan to the inverter substrate and that is guided through the inverter and the first heat sink; and receive a second portion of air that is discharged from the first blowing fan to the inverter substrate and that is guided by the first side fence and the supporting guide. The exhaust slit may be configured to discharge, to the area below the lower plate, the first portion of air and the second portion of air that are guided to the rear fence.

In some implementations, the induction heating device may further include: a resonance substrate disposed on the lower surface of the indicator substrate support, where the resonance substrate includes (i) a resonance capacitor connected to the working coil and configured to generate resonance of the working coil based on the switching operation of the inverter and (ii) a second heat sink configured to dissipate heat generated by the resonance capacitor; and a second blowing fan disposed at the lower plate and configured to draw air from the outside of the case through the inlet and discharge the air to the resonance substrate. The exhaust slit may be configured to discharge, to the area below the lower plate, at least a portion of air discharged from the second blowing fan to the resonance substrate.

In some implementations, the inlet may include: a first inlet defined in a first area of the lower plate that overlaps with the first blowing fan; and a second inlet defined in a second area of the lower plate that overlaps with the second blowing fan. The exhaust slit may include: (i) a first exhaust slit defined in a third area of the lower plate, where the third area is spaced apart from the first area, and the inverter substrate is disposed between the first area and the third area of the lower plate; (ii) a second exhaust slit defined in a fourth area of the lower plate, where the fourth area is spaced apart from the second area, and the resonance substrate is disposed between the second area and the fourth area of the lower plate; and (iii) a third exhaust slit defined in a fifth area of the lower plate, wherein the fifth area is disposed between the rear fence and the supporting guide.

In some examples, the resonance substrate may be disposed at a center area of the lower surface of the indicator substrate support between the front fence and the rear fence, and the inverter substrate may be disposed at one side of the resonance substrate adjacent to the first side fence and the rear fence. In some examples, the first blowing fan may be configured to decrease a temperature of the inverter by blowing air to the inverter substrate, and the second blowing fan may be configured to decrease a temperature of the resonance capacitor by blowing air to the resonance substrate.

In some implementations, the induction heating device may further include a mica sheet disposed between the inverter substrate and the lower plate and configured to provide insulation between the inverter substrate and the lower plate. In some examples, the mica sheet may have a first side surface that is attached to the lower plate by a sealant and a second side surface that contacts the first heat sink.

In some implementations, at least one of the lower plate or the side plate may define an inlet slit spaced apart from the inlet and an additional exhaust slit spaced apart from the exhaust slit. In some examples, the induction heating device may further include: a base plate that seats the working coil on an upper surface of the base plate; an indicator substrate that is disposed on an upper surface of the indicator substrate support, that is disposed vertically below the base plate, and that includes a plurality of light emitting elements; and a third blowing fan disposed at a lower surface of the base plate and configured to draw air from the outside of the case through the inlet slit and discharge the air to an air flow path defined between the base plate and the indicator substrate. The additional exhaust slit may be configured to discharge, to the outside of the case, air discharged from the third blowing fan to the air flow path.

In some implementations, the indicator substrate support may include an upper fence that extends along an edge of the upper surface of the indicator substrate support, where the air flow path is surrounded by the lower surface of the base plate, the upper surface of the indicator substrate, and the upper fence. In some examples, the base plate may be made of aluminum (Al). In some examples, the third blowing fan may be configured to decrease a temperature of the plurality of light emitting elements by blowing air to the air flow path.

In some implementations, the induction heating device may further include: a light guide that is disposed on the base plate around the working coil and that includes a light emitting surface configured to indicate (i) whether the working coil is driven and (ii) an output intensity of the working coil; a ferrite core disposed on the base plate vertically below the working coil and configured to diffuse an alternating magnetic field generated by the working coil; and an additional mica sheet disposed between the working coil and the ferrite core and configured to block heat transfer from the working coil to the ferrite core. The plurality of light emitting elements may be disposed vertically below the light guide and configured to emit light to the light guide.

In some implementations, each of the inverter and the first heat sink may be attached to a lower surface of the inverter substrate, and the lower surface of the inverter substrate and the lower plate may define an air passage therebetween configured to guide air discharged from the first blow fan to the exhaust slit. In some examples, the inverter may be disposed between the supporting guide and the first heat sink. In some examples, the second portion of the rear fence may be recessed inward toward the front fence.

Hereafter, a specific effect of the present disclosure, further to the above-mentioned effect, will be described together while describing a specific matter for implementing the present disclosure.

DETAILED DESCRIPTION

Figure 1:
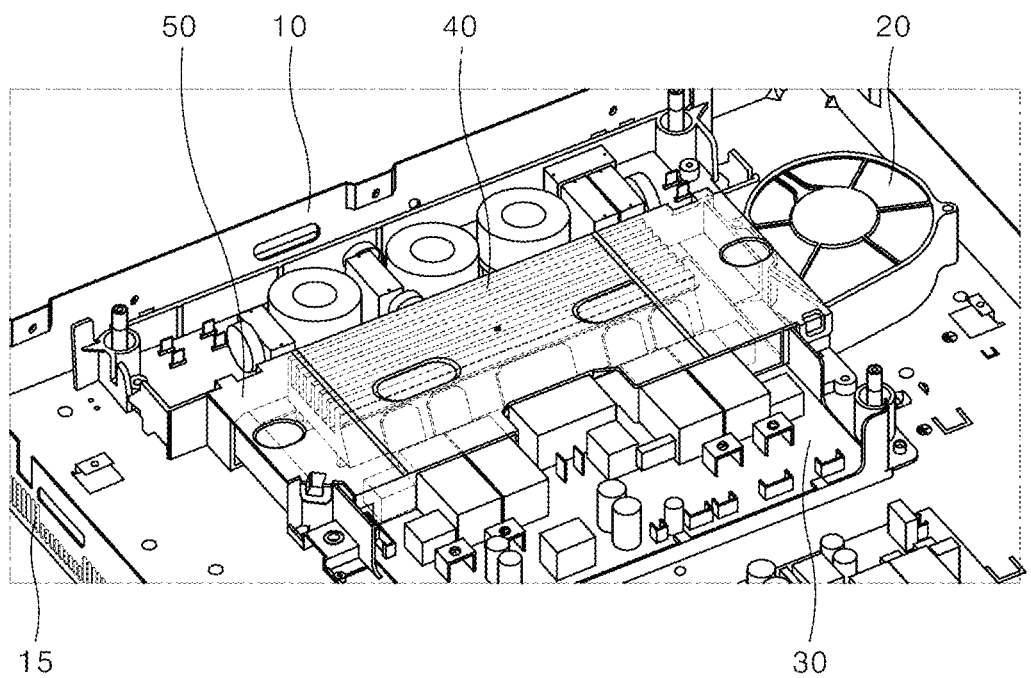
FIG. 1 is a schematic view showing a cooling structure of an induction heating device in related art.

The above mentioned objects, features, and advantages of the present disclosure will be described in detail with reference to the accompanying drawings, so that those skilled in the art to which the present disclosure pertains may easily implement the technical idea of the present disclosure. In the description of the present disclosure, when it is determined that the detailed description of the known technology related to the present disclosure may obscure the gist of the present disclosure, the detailed description thereof will be omitted. Hereinafter, example implementations of the present disclosure will be described in detail with reference to the accompanying drawings. A same reference numeral in the drawings is used to indicate same or similar component.

Hereinafter, an induction heating device is described according to one or more implementations of the present disclosure.

Figure 2:
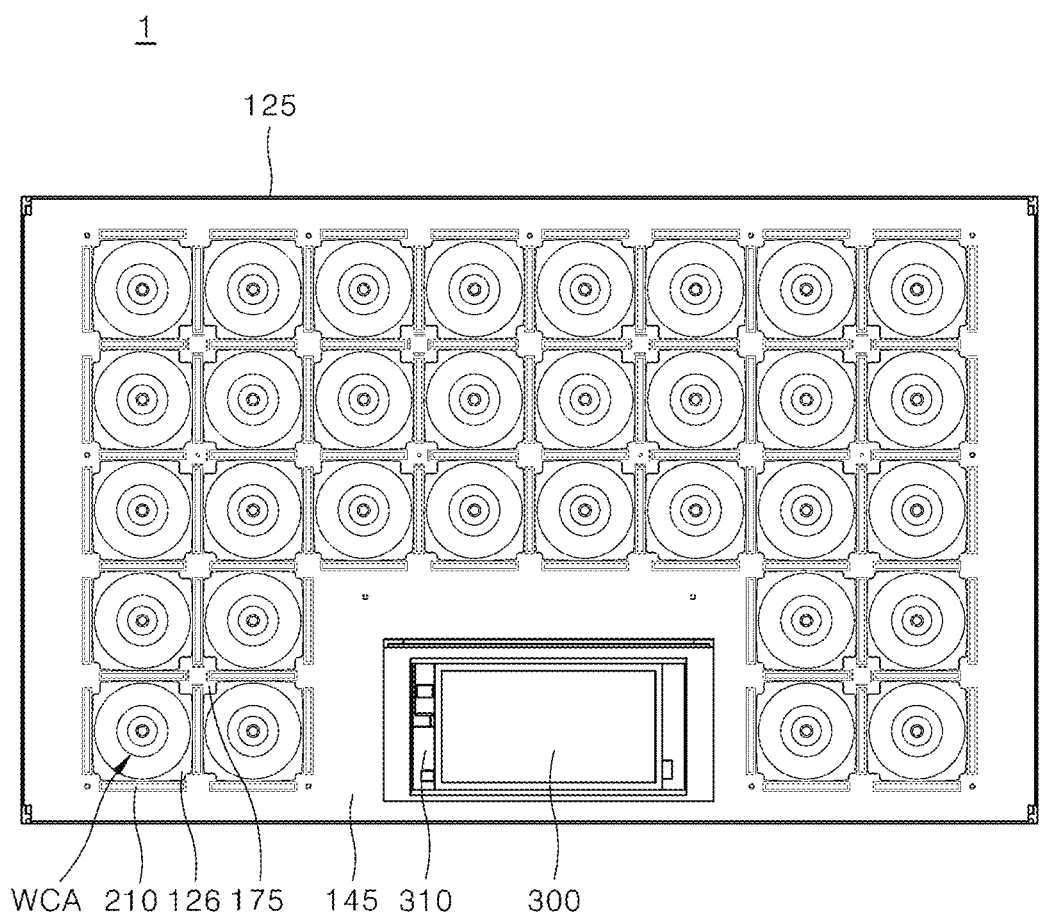
FIG. 2 is a plan view showing an induction heating device according to an implementation of the present disclosure.
Figure 3:
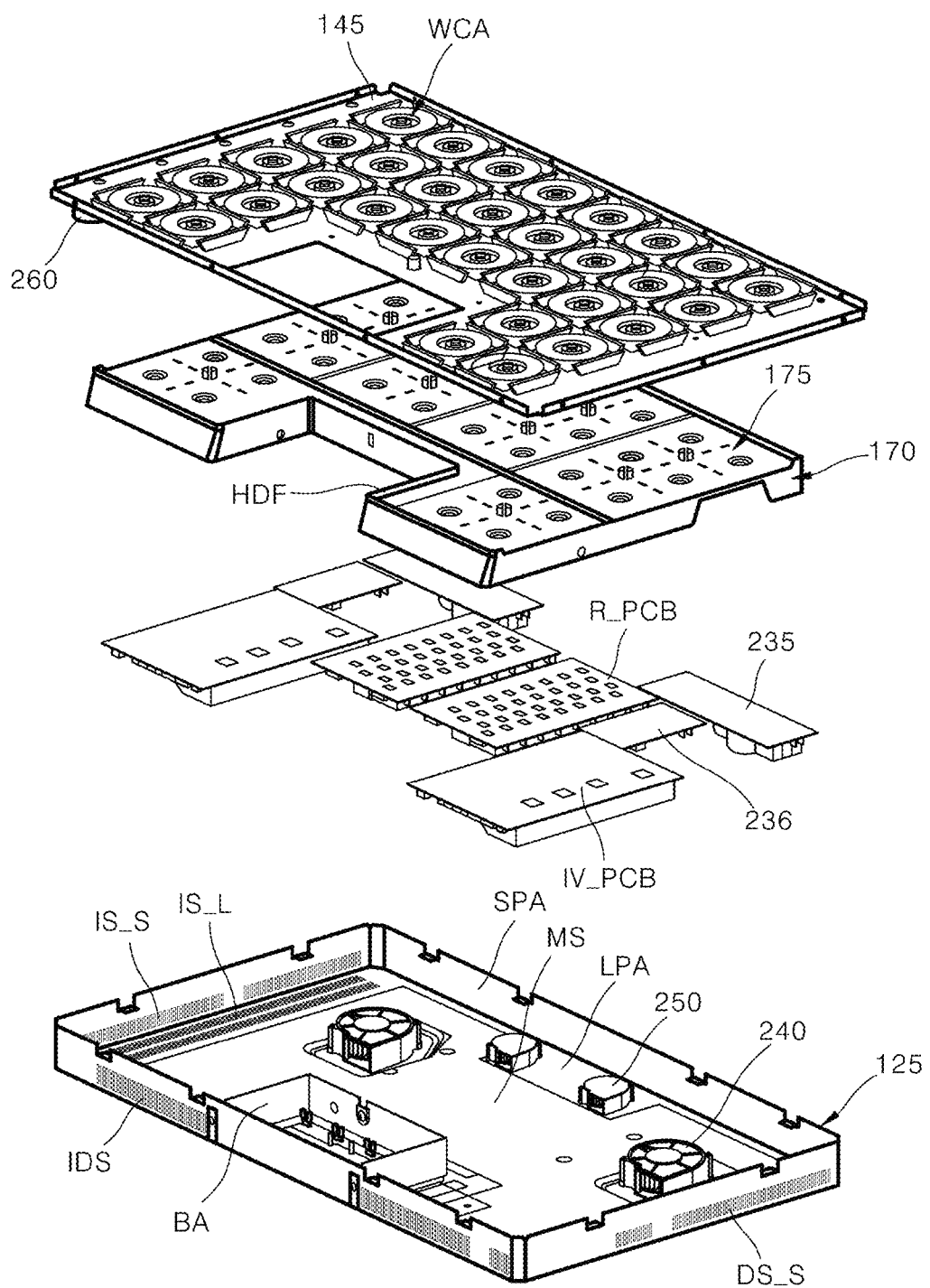
FIG. 3 is an exploded perspective view showing the induction heating device in FIG. 2.
Figure 4:
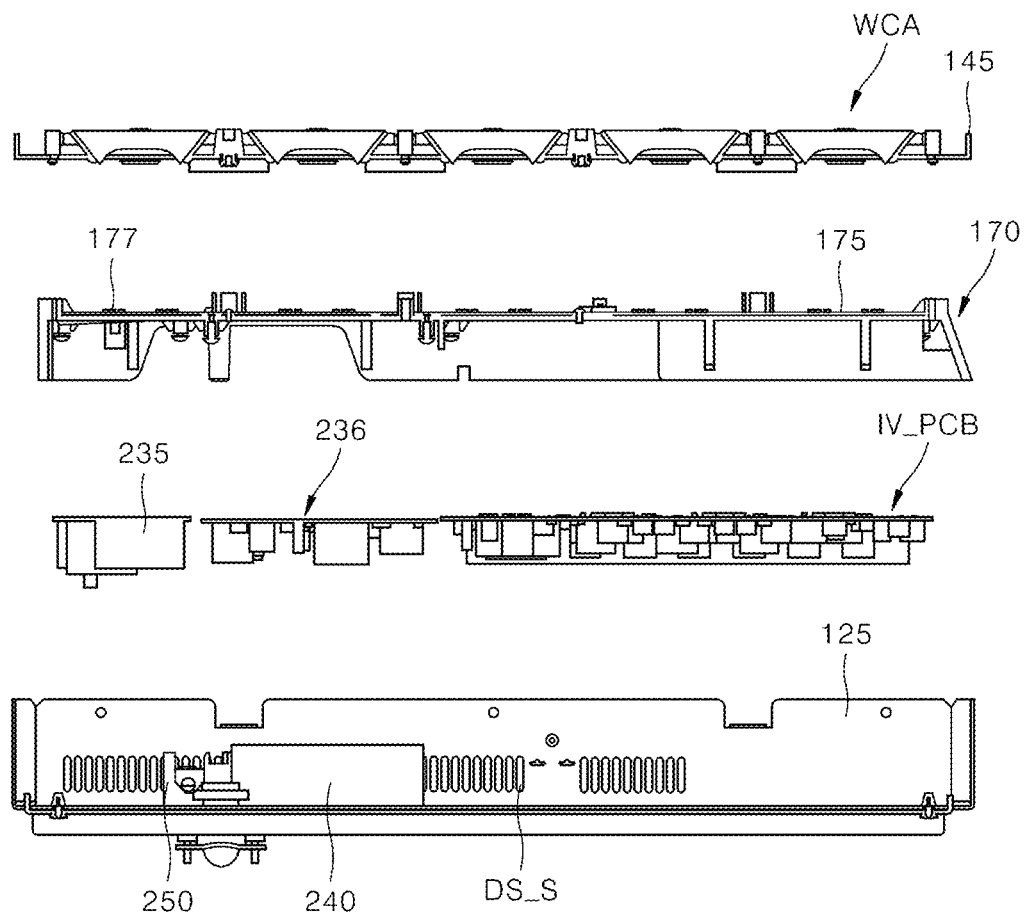
FIG. 4 is a cross-sectional view of the induction heating device in FIG. 3.
Figure 5:
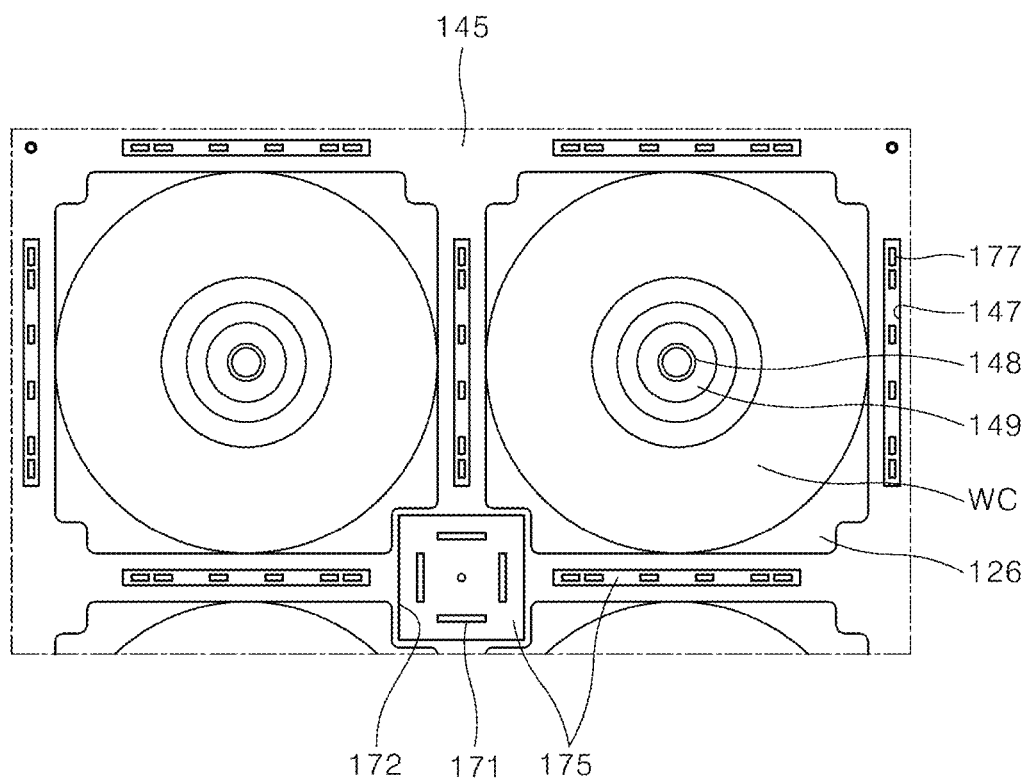
FIGS. 5 and 6 are partially enlarged views showing the induction heating device in FIG. 2.
Figure 6:
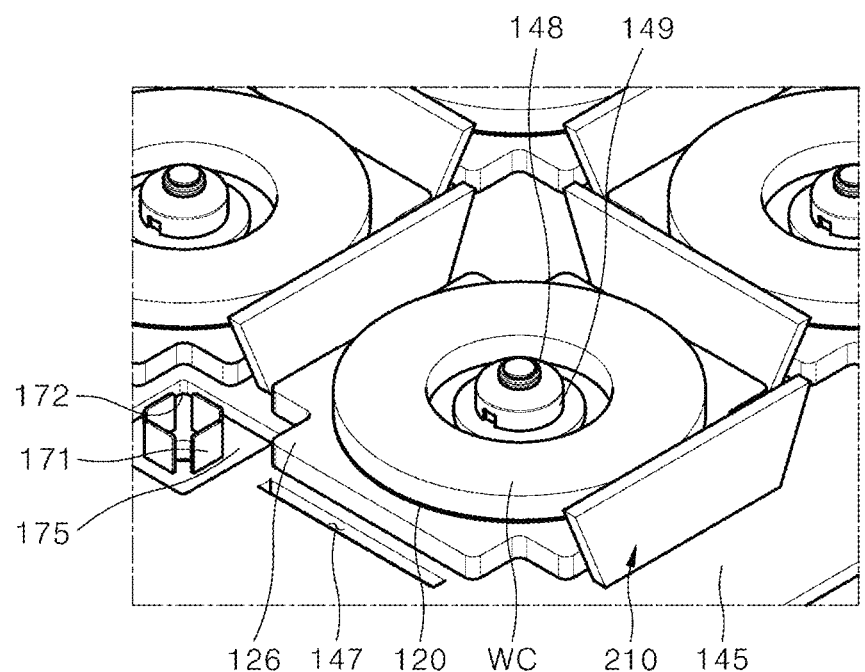

FIG. 2 illustrates an example of an induction heating device. FIG. 3 is an exploded perspective view showing the induction heating device in FIG. 2. FIG. 4 is a cross-sectional view showing the induction heating device in FIG. 3. FIGS. 5 and 6 are partially enlarged views showing the induction heating device in FIG. 2.

For convenience of explanation, in FIGS. 2 to 4, the cover plate is omitted. For convenience of explanation, in FIG. 5, a light guide is omitted.

Referring to FIGS. 2 to 6, an induction heating device 1 may include a case 125, a cover plate 119 (see FIG. 7), a base plate 145, and an indicator substrate support 170, an indicator substrate 175, a light emitting element 177, a light guide 210, an EMI filter 235, a switched mode power supply (SMPS) 236, a first blowing fan 240, a second blowing fan 250, a third blowing fan 260, an input interface 300, and a controller for input interface 310, a working coil assembly WCA, a resonance substrate R_PCB, and an inverter substrate IV_PCB.

The case 125 may accommodate various types of components of the induction heating device 1, for example, the working coil assembly WCA, the base plate 145, the indicator substrate support 170, the indicator substrate 175, the light emitting element 177, the light guide 210, the EMI filter 235, the SMPS 236, the first blowing fan 240, the second blowing fan 250, the third blowing fan 260, the controller for input interface 310, the resonance substrate R_PCB, and the inverter substrate IV_PCB.

In some examples, the case 125 may include various types of devices related to the driving of the working coil WC. For instance, the case 125 may include a power supply that provides an alternating current (AC) power (i.e., input power), a controller for an inverter substrate that controls the driving of components of the inverter substrate IV_PCB, and a relay or a semiconductor switch that turns on and turns off the working coil WC, but details of the various types of devices related to the driving of the working coil WC are omitted.

The case 125 may be thermally insulated to prevent heat generated by the working coil WC from being leaking to the outside.

Further, the case 125 may include a lower plate LPA and a side plate SPA that extends upward along an edge of the lower plate LPA.

Inlets IP1 and IP2 (see FIG. 11) and exhaust slits DS1 to DS3 (see FIG. 11) described below may be defined at a portion of an area of the lower plate LPA. In some examples, inlet slits IS_S and IS_L and additional exhaust slits (DS_S in FIG. 3 and DS_L in FIG. 12) described below, may be defined in a remaining area of the lower plate LPA and the side plate SPA. Details of the inlet, inlet slit, and the exhaust slit are described below.

In some implementations, an inlet and exhaust slit IDS may also be defined on the side plate SPA, and air may move to an inside of and to an outside of the case 125 through the inlet and exhaust slit IDS.

Further, a barrier BA may be installed at a periphery of an area, on the lower plate LPA, where the controller for the input interface 310 is installed, and the barrier BA may extend upward from the periphery of the area where the controller for the input interface 310 is installed.

Specifically, the barrier BA may be made of, for example, metal, and may prevent heat generated due to the driving of peripheral components from being introduced into the controller for the input interface 310 and the input interface 300.

Figure 9:
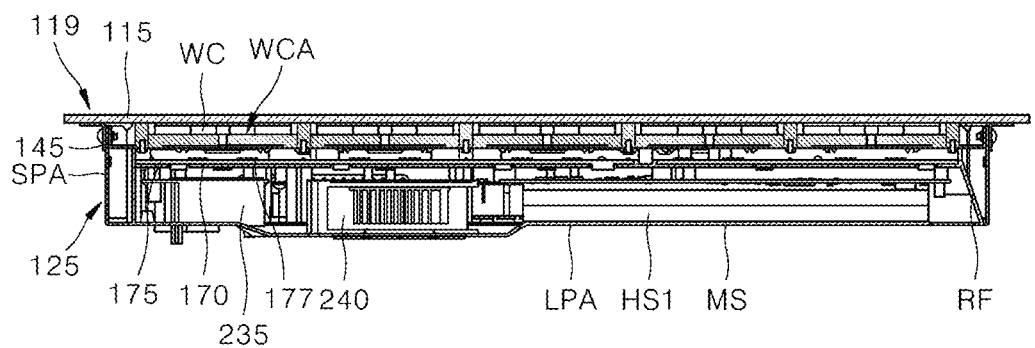
FIG. 9 is a cross-sectional view taken along line AA' in FIG. 8.

In some implementations, a silicone rubber may be inserted between an upper end of the barrier BA and a lower surface of the top plate 115 (see FIG. 9).

A mica sheet MS may be provided between the lower plate LPA and the inverter substrate IV_PCB to insulate the lower plate LPA and the inverter substrate IV_PCB, of the case 125.

Specifically, one surface of the mica sheet MS may be attached to the lower plate LPA through a sealant, and the other surface of the mica sheet MS may contact the first heat sink HS1 (see FIG. 7) described below.

Further, the first blowing fan 240 and the second blowing fan 250 may be installed on the lower plate LPA of the case 125, and details of the above configuration are described below.

The cover plate 119 (see FIG. 9) is coupled to an upper end of the case 125 (i.e., an upper end of the side plate SPA) to close an inside of the case 125, and an object may be disposed on the upper surface of the cover plate 119.

Specifically, the cover plate 119 may include a top plate 115 (see FIG. 9) to place the object such as a cooking vessel, the heat generated by the working coil WC may be transmitted to the object through the top plate 115.

The top plate 115 may be made of, for example, glass. Further, the input interface 300 may be flatly buried in the top plate 115 and configured to receive input from a user and transmits the input to the controller for input interface 310, but is not limited. In some examples, the input interface 300 may be installed at a position other than the top plate 115. In some examples, an upper surface of the input interface 300 may be flush with an upper surface of the top plate 115.

In some implementations, the input interface 300 is a module that inputs a heating intensity or driving time of the induction heating device 1 desired by the user, and may be variously implemented with a physical button or a touch panel. Further, the input interface 300 may include, for example, a power button, a lock button, a power level control button (+, −), a timer control button (+, −), a charging mode button, and the like, and may display a specific image (e.g., an image of a heating zone, an image of a heating intensity, and the like).

Further, the input interface 300 may transfer the input received from the user to the controller for the input interface 310, and the controller for the input interface 310 may transfer the input to the above-described controller (i.e., the controller for the inverter substrate). Details thereof are omitted.

In some implementations, the working coil assembly WCA may include a working coil WC, a ferrite core 126, and an additional mica sheet 120.

In some implementations, when the induction heating device 1 is a zone-free type induction heating device, a plurality of working coil assemblies WCA may be present as shown in FIGS. 2 to 6, and a plurality of working coil assemblies (e.g., the WCAs) may be spaced apart from one another by a predetermined distance.

However, for convenience of description, one working coil assembly WCA is described.

Specifically, the working coil WC may include a conductive wire annularly wound with a plurality of times and may generate an alternating magnetic field. Further, the additional mica sheet 120 and the ferrite core 126 may be sequentially disposed below the working coil WC.

The ferrite core 126 may be disposed below the working coil WC, and a core hole may be defined at a central portion of the ferrite core 126 to vertically overlap with an annular inner side of the working coil WC.

Specifically, the base plate 145 may be disposed below the ferrite core 126, and an additional mica sheet 120 may be disposed between the ferrite core 126 and the working coil WC.

Further, as shown in FIGS. 5 and 6, a packing gasket 149 may be inserted into the core hole so that the ferrite core 126 may be fixed to the base plate 145. A sensor 148 may be installed at the upper end of the packing gasket 149. In some implementations, the sensor 148 detects the temperature of the top plate 115 (see FIG. 9), the temperature of the working coil WC, the operation of the working coil WC, and the like, and may transmit, to the above-mentioned controller for the input interface 310, the temperature information or the operation information.

Further, the ferrite core 126 may be fixed to the additional mica sheet 120 through the sealant, and may function to diffuse an alternating magnetic field generated by the working coil WC.

The additional mica sheet 120 may be disposed between the working coil WC and the ferrite core 126, and a sheet hole may be defined at the center thereof to vertically overlap with the annular inner side of the working coil WC.

Specifically, the additional mica sheet 120 may be fixed to the working coil WC and the ferrite core 126 through the sealant, and may prevent the heat generated by the working coil WC directly transferred to the ferrite core 126.

In some implementations, the induction heating device 1 may further include an additional mica sheet fixed to the upper end of the working coil WC through the sealant and defining a sheet hole to vertically overlap with the annular inner side of the working coil WC at the center thereof.

The working coil assembly WCA is installed on an upper surface of the base plate 145.

Specifically, the ferrite core 126, the additional mica sheet 120, and the working coil WC are sequentially stacked on the base plate 145, and the base plate 145 is spaced upward apart from the indicator substrate support 170.

In some implementations, the indicator substrate 175 may be installed on the upper surface of the indicator substrate support 170 and is spaced downward from the base plate 145. Accordingly, an air flow path described below may be defined between the base plate 145 and the indicator substrate 175. Details thereof are described below.

Further, as shown in FIGS. 5 and 6, a connection hole 172 may be defined in the space between the ferrite cores on the base plate 145 to provide a space of the connector 171.

The connector 171 may protrude from the indicator substrate 175 to arrange wires and electrical connection of the working coil WC. That is, the conductive wires of the working coils disposed around the connector 171 may be connected.

Further, the base plate 145 may be integrated, for example, and made of aluminum (Al), but is not limited thereto.

In some implementations, the third blowing fan 260 may be installed at one side of the lower surface of the base plate 145 and may suction the outside air (e.g., outside cool air) through the inlet slits IS_L and IS_S defined in the lower plate LPA and the side plate SPA of the case 125, and may discharge the air to the air flow path defined between the base plate 145 and the indicator substrate 175.

More specifically, as shown in FIG. 3, an upper fence HDF is provided on the upper surface of the indicator substrate support 170 and the upper fence HDF is provided along an edge of the upper surface of the indicator substrate support 170. The air flow path may be surrounded by the lower surface of the base plate 145, the upper surface of the indicator substrate 175, and the upper fence HDF.

Further, the base plate 145 may be integrated, and the air flow path may be surrounded by the lower surface of the base plate 145, the upper surface of the indicator substrate 175, and the upper fence HDF. The air discharged from the third blowing fan 260 to the air flow path may be discharged to the outside of the case 125 through the additional exhaust slits (DS_S in FIG. 3 and DS_L in FIG. 12). The air discharged by the third blowing fan 260 may move through the air flow path, to reduce the temperature of the working coil WC and the temperature of the indicator (in particular, a plurality of light emitting elements 177).

That is, as the cool air is circulated through the air flow path, the temperature of the working coil WC and the temperature of the indicator (in particular, the plurality of light emitting elements 177 may be reduced. Further, the heating of the working coil WC and the indicator (in particular, the plurality of light emitting elements 177) generated due to radiation and a convection current may be resolved.

The light guide 210 may be installed on the base plate 145.

Specifically, the light guide 210 may be installed on the base plate 145 to be provided around the working coil WC. That is, four light guides 210 per one working coil WC may be installed around the working coil WC.

The light guide 210 may display whether the working coil WC is driven and output intensity of the working coil WC through a light emitting surface (i.e., an upper surface).

As shown in FIGS. 5 and 6, a light guide installation hole 147 to install the light guide 210 may be defined in the space between the ferrite cores, in the base plate 145. That is, the light guide installation hole 147 may be defined in the base plate 145 at the position in which the light guide 210 is installed. Accordingly, the light guide installation hole 147 may also be defined around the working coil WC, and four light guide installation holes 147 per one working coil WC may be defined around the working coil.

In some implementations, the light guide installation hole 147 may not overlap with a connection hole 172, and the number of the light guide installation holes 147 may be the same as the number of the light guides 210.

In some implementations, light emitted by the light emitting element 177 installed on the indicator substrate 175 may be transmitted to the light guide 210 through the light guide installation hole 147, and the light guide 210 may display the light emitted by the light emitting element 177 through the light emitting surface (i.e., the upper surface) of the upper end thereof.

The indicator substrate 175 may be installed on the upper surface of the indicator substrate support 170 to be spaced downward from the base plate 145, and a plurality of light emitting elements 177 may be installed.

The plurality of light emitting elements 177 may be, for example, light emitting diodes (LEDs), and the plurality of light emitting elements 177 may be symmetrical with respect to a center of the lower surface of the light guide 210, but is not limited thereto.

In some implementations, the indicator substrate 175 may have, for example, a form of a printed circuit board (i.e., PCB), and may drive a plurality of light emitting elements 177 based on the control signal received from the above-mentioned controller for the inverter substrate or the controller for the input interface 310. Further, although not shown in the figures, various types of components may be installed in the indicator substrate 175 to drive the plurality of light emitting elements 177.

The indicator substrate support 170 may be coupled to the lower plate LPA to be disposed below the working coil WC.

Specifically, the indicator substrate 175 may be installed on the upper surface of the indicator substrate support 170, and the EMI filter 235, the SMPS 236, the resonance substrate R_PCB, and the inverter substrate IV_PCB may be installed on the lower surface of the indicator substrate 175.

Further, the above-described upper fence HDF is provided on the upper surface of the indicator substrate support 170, and a lower fence LDF (see FIG. 7) and the supporting guide (SG in FIG. 7) may be provided on the lower surface of the indicator substrate support 170.

That is, the upper fence HDF of the indicator substrate support 170 supports the lower surface of the base plate 145, and the lower fence LDF (see FIG. 7) of the indicator substrate support 170 may be supported by the lower plate LPA. Details of the indicator substrate support 170 are described below.

In some implementations, according to an implementation of the present disclosure, the induction heating device 1 may also have a function for transmitting wireless power based on the above-mentioned configuration and feature.

That is, power is wirelessly supplied and is applied to a plurality of electronic devices. Electronic devices that use a technology for transmitting wireless power are charged by simply placing the electronic devices on a charging pad without connecting the electronic device to an additional charge connector. The electronic devices that transmit the wireless power may not require a wired cord or a charger, thereby improving portability of the electronic devices and reducing a size and a weight of the electronic devices.

The technology for transmitting the wireless power may use an electromagnetic induction method using a coil, a resonance method using resonance, and a radio wave radiation method in which electrical energy is converted into a microwave and the converted microwave is transmitted. The electromagnetic induction method uses electromagnetic induction between a primary coil (e.g., a working coil WC) provided in a device that transmits wireless power and a secondary coil provided in a device that receives wireless power to transmit the power.

In some implementations, the induction heating method of the induction heating device 1 substantially has the same principle as the technology for transmitting the wireless power using electromagnetic induction in that the object is heated by electromagnetic induction.

Therefore, according to an implementation of the present disclosure, the induction heating device 1 may perform a function for transmitting the wireless power, as well as performing a function of induction heating. Further, an induction heating mode or a wireless power transmission mode may be controlled by the controller for the input interface (or the controller for the input interface 310). Thus, the function for inductively heating the object or the function for transmitting the wireless power may be selectively performed as necessary.

As described above, the induction heating device 1 according to the implementation of the present disclosure has the above-described configuration and features, and hereinafter, some components (e.g., the above-mentioned case 125, the indicator substrate support 170, and the first blowing fan 240 and the second blowing fan 250) of the induction heating device 1 in FIG. 3 is described in detail.

Figure 7:
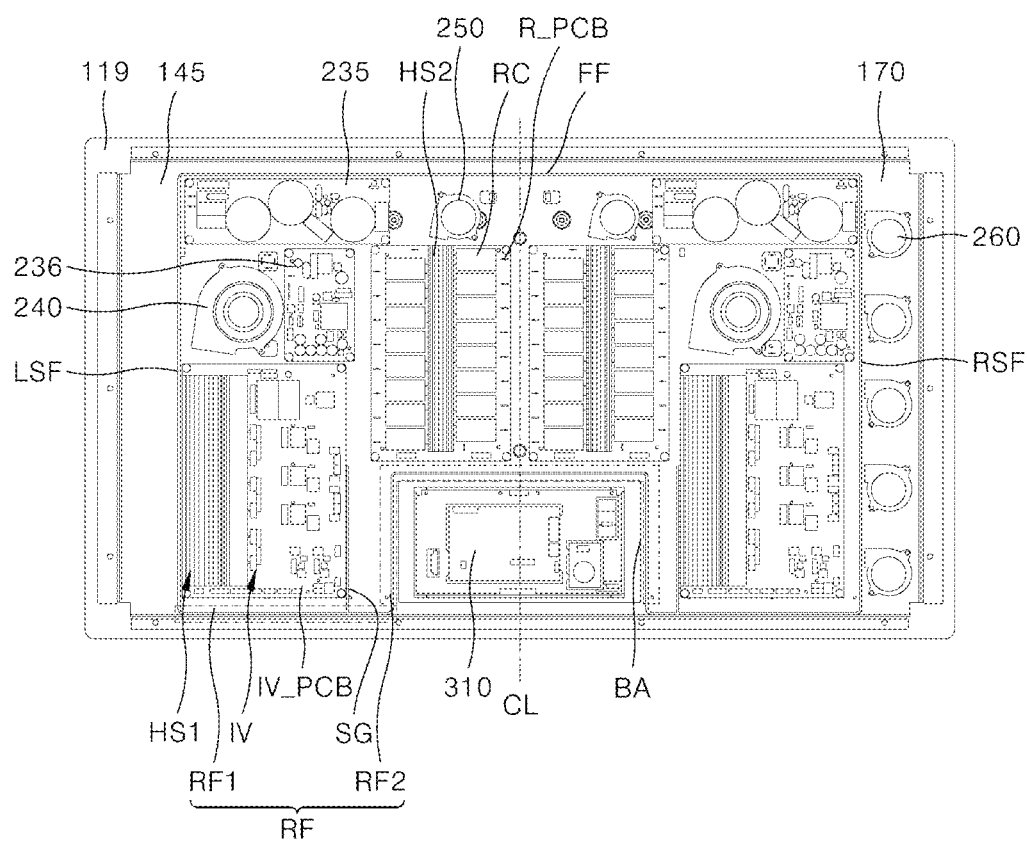
FIG. 7 is a plan view showing examples components of the induction heating device in FIG. 3.
Figure 8:
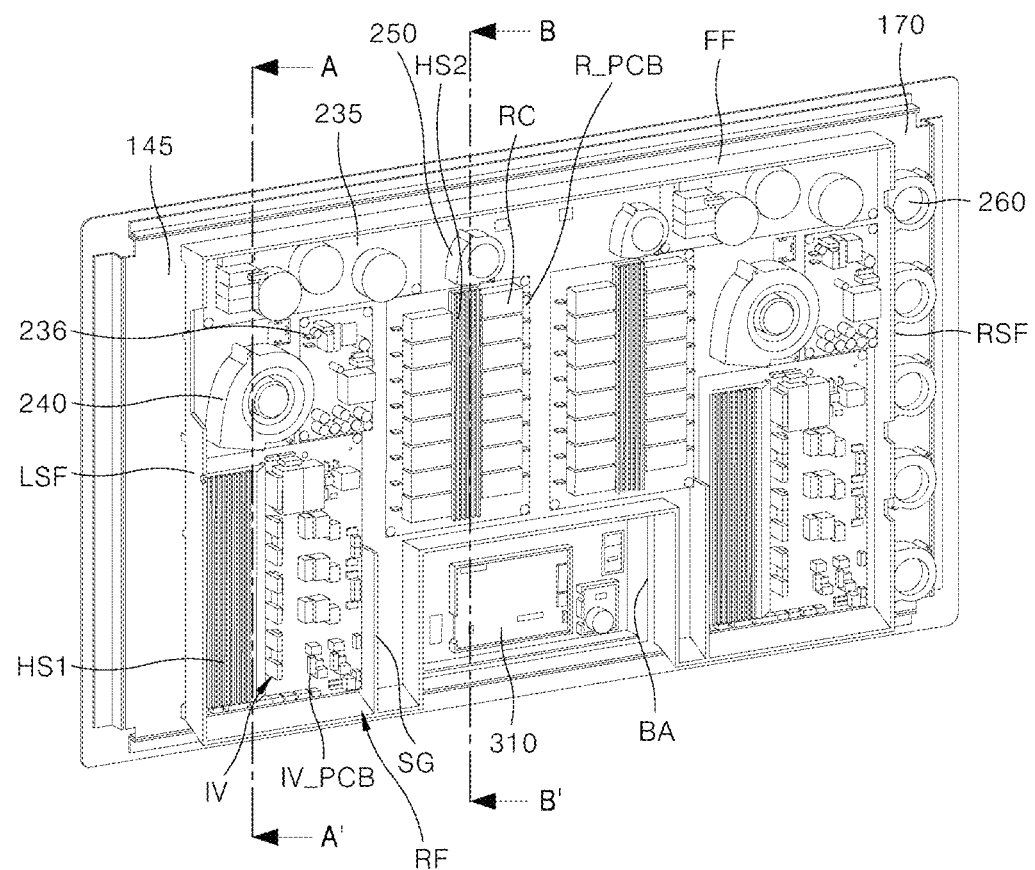
FIG. 8 is a perspective view showing the induction heating device in FIG. 7.
Figure 10:
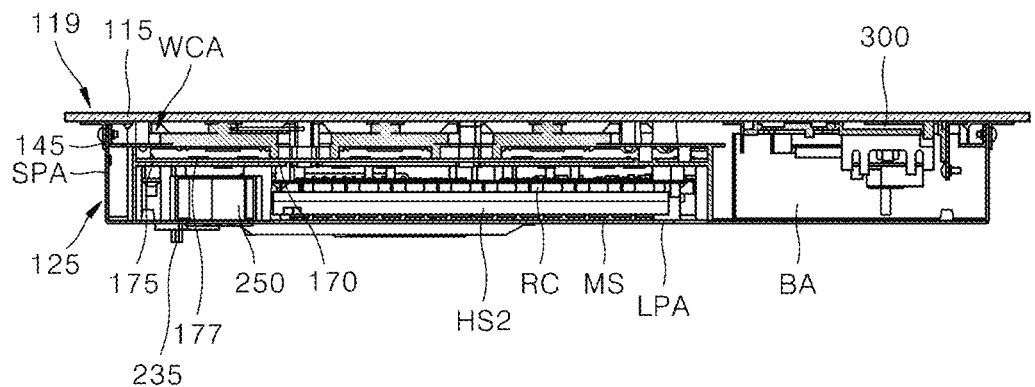
FIG. 10 is a cross-sectional view taken along line BB' in FIG. 8.
Figure 11:
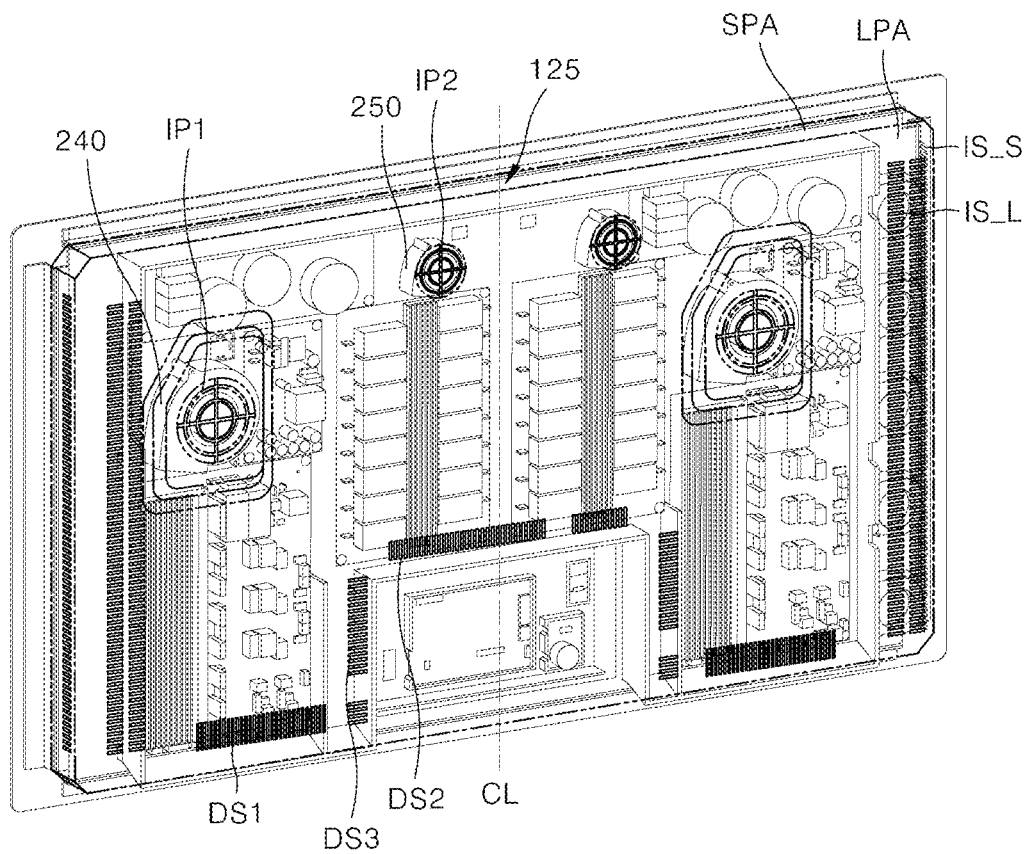
FIG. 11 is a perspective view showing an example case added to the induction heating device in FIG. 8.
Figure 12:
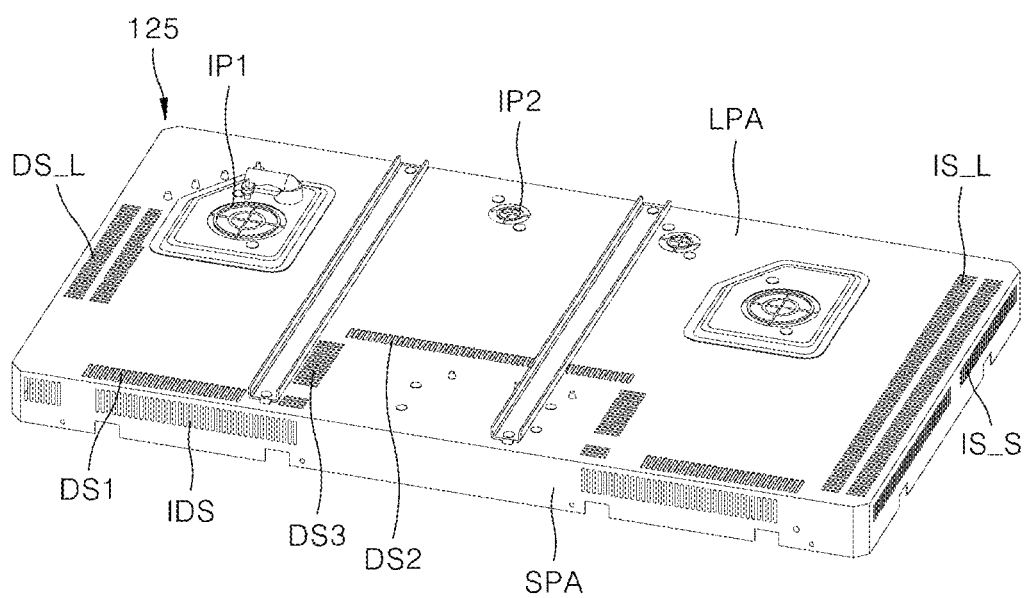
FIG. 12 is a perspective view of the case in FIG. 11.
Figure 13:
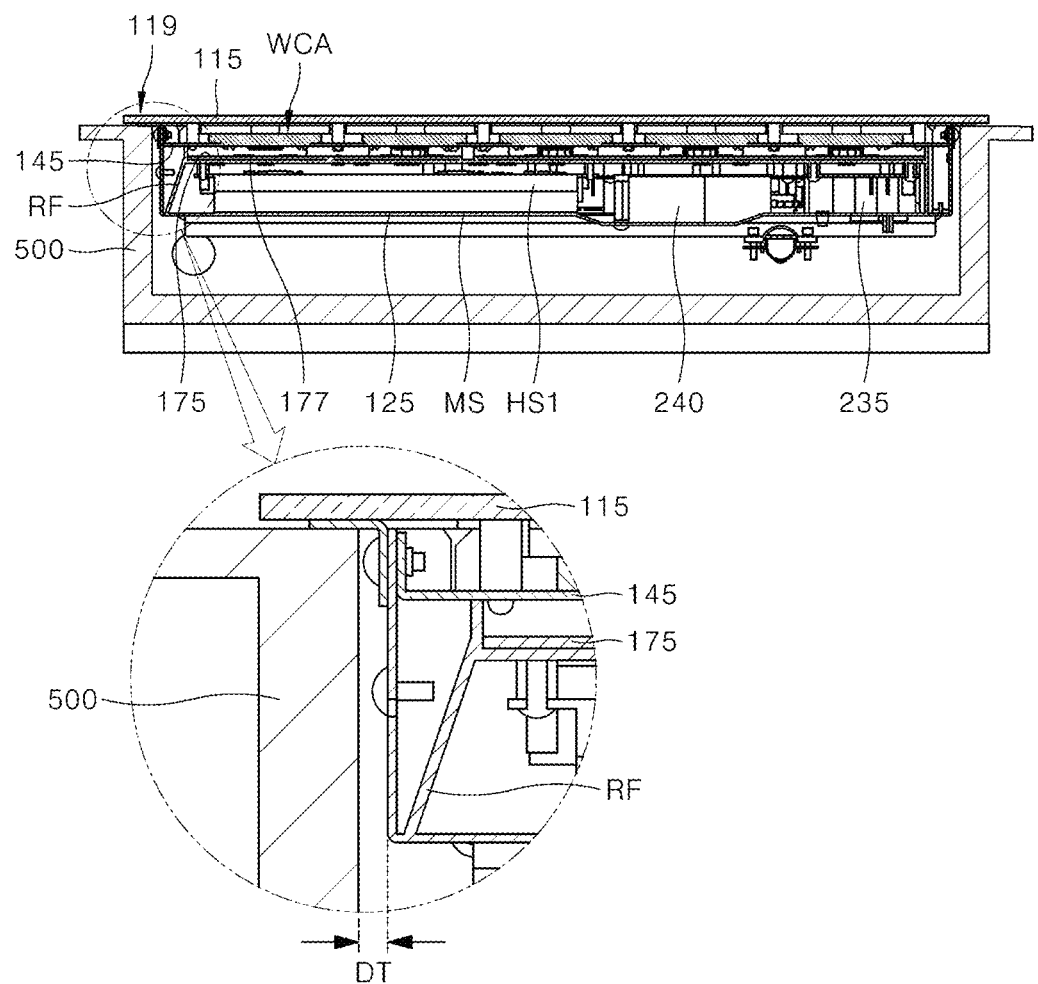
FIG. 13 is a cross-sectional view showing the induction heating device in FIG. 2 installed in an example storage space.
Figure 14:
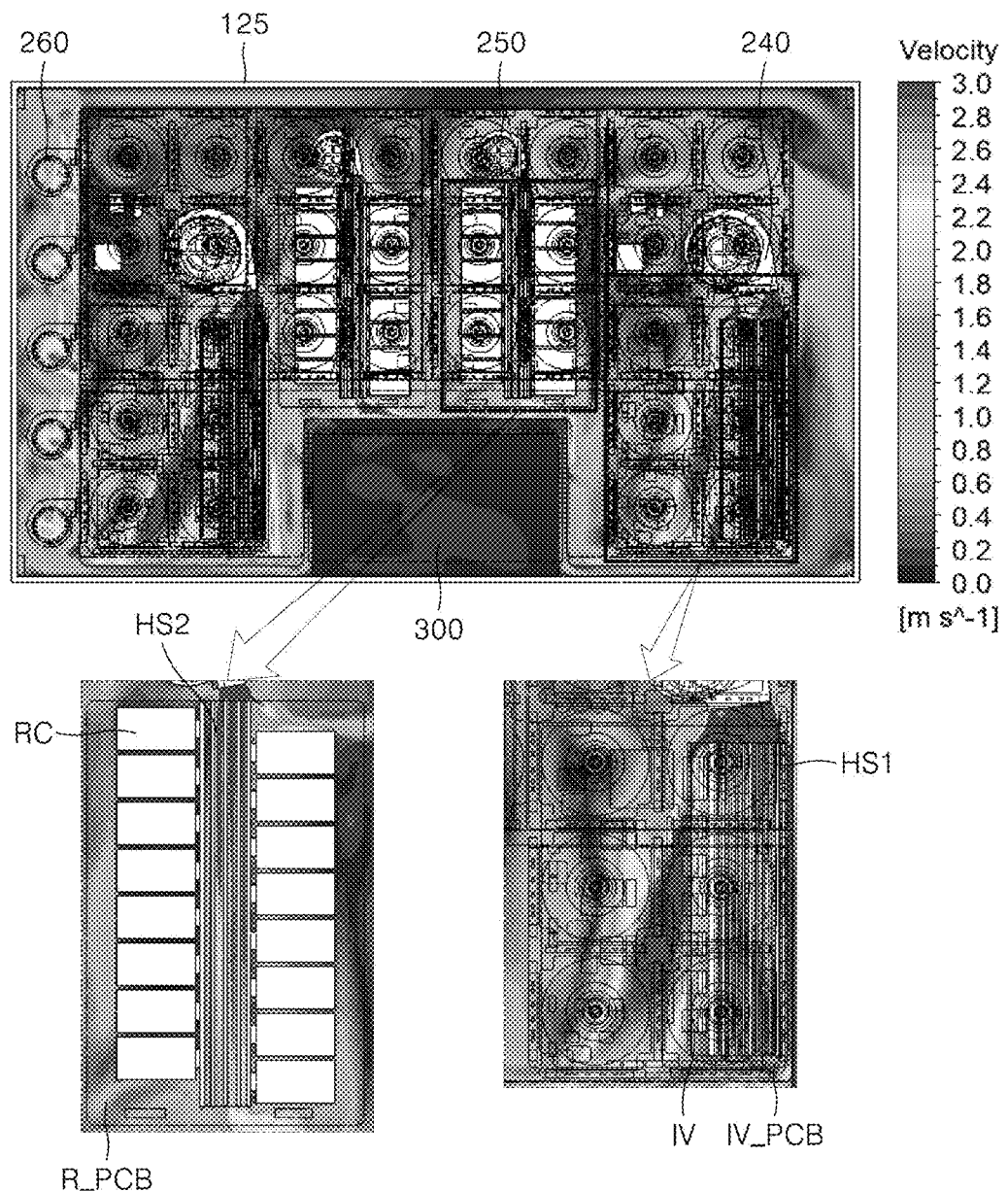
FIGS. 14 and 15 are schematic views showing examples of heat flow generated when the induction heating devices in FIG. 2 are driven.
Figure 15:
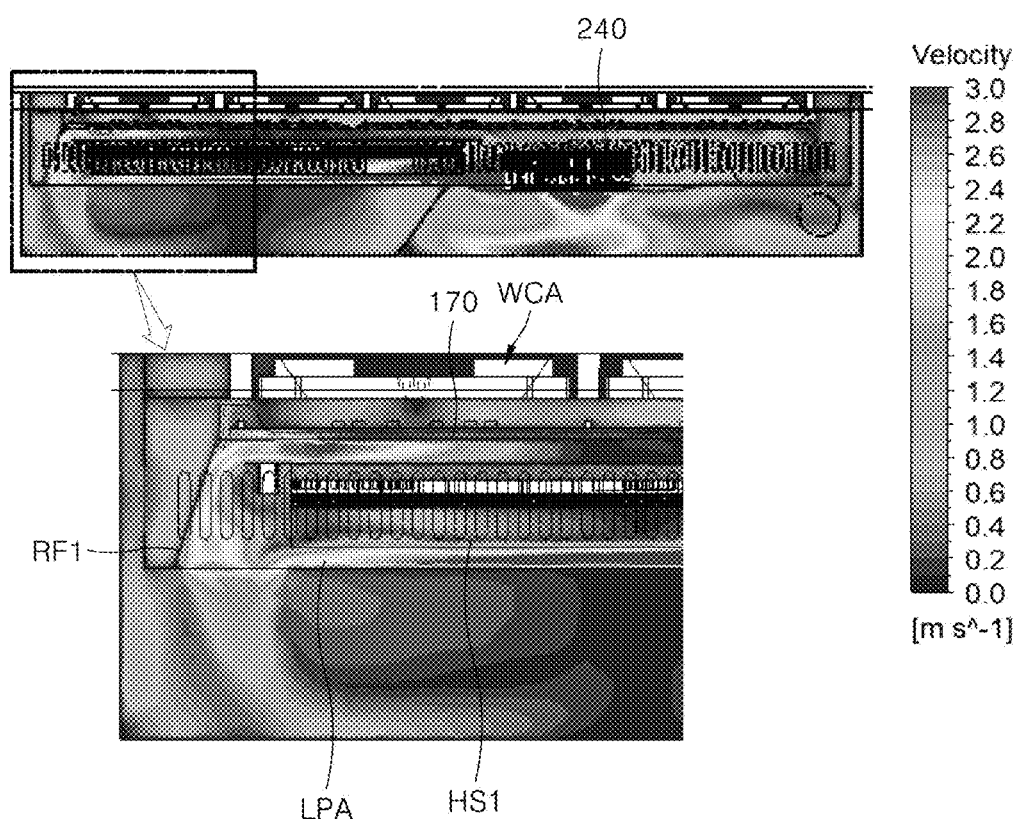

FIG. 7 is a plan view showing example components in FIG. 3. FIG. 8 is a perspective view of the induction heating device in FIG. 7. FIG. 9 is a cross-sectional view taken along line AA' in FIG. 8. FIG. 10 is a cross-sectional view taken along line BB' in FIG. 8. FIG. 11 shows an example case added to the induction heating device in FIG. 8. FIG. 12 is a perspective view showing the case in FIG. 11. FIG. 13 is a cross-sectional view showing the induction heating device in FIG. 2 installed in an example storage space. FIGS. 14 and 15 are schematic views showing examples of heat flow generated when the induction heating device in FIG. 2 is driven.

For convenience of description, FIGS. 7 and 8 show a first blowing fan 240 and second blowing fan 250 installed on a lower surface of an indicator substrate support 170. In some examples, the first blowing fan 240 and the second blowing fan 250 may be installed in the lower plate LPA.

Referring to FIGS. 7 to 12, an EMI filter 235, an SMPS 236, a resonance substrate R_PCB, and an inverter substrate IV_PCB may be installed on a lower surface of the indicator substrate support 170.

In some implementations, the EMI filter 235, the SMPS 236, the inverter substrate IV_PCB, and the resonance substrate R_PCB may be provided in pairs, respectively, and the pair of EMI filter, SNIPS, resonance substrate, and inverter substrate may be bilaterally symmetrical with respect to a center line CN across the lower surface of the indicator substrate support 170. One EMI filter 235, one SNIPS 236, one resonance substrate (R_PCB), and one inverter substrate (IV_PCB) are described below.

In detail, the EMI filter 235 may be installed on the bottom surface of the indicator substrate support 170 and may receive the AC power from the above-described power supply. Further, the EMI filter 235 may reduce noise of the received AC power (i.e., Electro Magnetic Interference (EMI)) and provide the SNIPS 236 with the AC power having reduced noise.

The SNIPS 236 may be installed on the lower surface of the indicator substrate support 170, and may receive, from the EMI filter 235, the AC power with reduced noise. Further, the SNIPS 236 may convert the received AC power into DC power and may provide the inverter substrate IV_PCB with the converted DC power.

The inverter substrate IV_PCB is installed on the lower surface of the indicator substrate support 170 and may include the inverter IV that applies the resonance current to the working coil WC through the switching operation and a first heat sink HS1 that radiates heat of the inverter IV.

Further, the inverter substrate IV_PCB may be installed adjacent to one side fence LSF and a rear fence RF to be disposed at one side of the resonance substrate R_PCB described below.

The inverter IV may receive the DC power from the SMPS 236 and may apply a resonance current to the working coil WC by performing a switching operation based on the received DC power.

Further, a plurality of inverters IVs may be provided, and the switching of the inverter IV may be controlled by the controller for the inverter substrate described above.

The inverter IV may include two switching elements, and the two switching elements may be alternately turned on and off based on a switching signal received from the controller for the inverter substrate. Further, high frequency alternating current (i.e., resonance current) may be generated through the switching of the two switching elements, and the generated high frequency alternating current may be applied to the working coil WC.

The resonance substrate R_PCB may be installed on the lower surface of the indicator substrate support 170 and may include the resonance capacitor RC connected to the working coil WC to resonate by the switching of the inverter IV and the second heat sink HS2 that radiates the heat of the resonance capacitor RC.

Further, the resonance substrate R_PCB may be installed between the front fence FF and the rear fence RF described below, to be disposed at the center of the lower surface of the indicator substrate support 170.

The resonance capacitor C resonates, when a resonance current is applied to the working coil WC by the switching operation of the inverter IV. Further, when the resonance capacitor C resonates, a current flowing through the working coil WC connected to the resonance capacitor C increases. That is, an eddy current may be induced into the object disposed above the working coil WC connected to the resonance capacitor C through this process.

In some implementations, a plurality of resonance capacitors RC may be provided.

In some implementations, a lower fence LDF and a supporting guide SG may be provided on the lower surface of the indicator substrate support 170.

For example, the lower fence LDF may include a front fence FF, a rear fence RF, one side fence LSF, and the other side fence RSF that extends along an edge of the lower surface of the indicator substrate support 170.

The front fence (FF), one side fence (LSF) and the other side fence (RSF) may extend downward from the lower surface of the indicator substrate support to have a right angle with the lower surface of the indicator substrate support 170, respectively.

In some examples, a first portion RF1 of the rear fence RF obliquely extends to have an obtuse angle with the lower surface of the indicator substrate support 170, and a second portion RF2 of the rear fence RF may extend downward to have a right angle with the lower surface of the indicator substrate support 170. The second portion RF2 is different from the first portion RF1.

In some implementations, a pair of first portions (e.g., RF1) may be provided on the lower surface of the indicator substrate support 170 and the pair of first portions (e.g., RF1) may be bilaterally symmetrical with respect to the center line CL.

Further, the second portion RF2 may extend downward to have a right angle with the lower surface of the indicator substrate support 170 along the edge (i.e., the edge of an area where the input interface 300 (see FIG. 2) is installed).

The second portion RF2 may surround the above-mentioned barrier BA.

In some implementations, the supporting guide SG may be spaced apart from the one side fence LSF. The inverter substrate IV_PCB may be provided between the supporting guide SG and the one side fence LSF.

In some implementations, the pair of supporting guides SG may be provided on the lower surface of the indicator substrate support 170 and the pair of supporting guides SG may be bilaterally symmetrical with respect to the center line CL.

The above-mentioned lower fence LDF and supporting guide SG are provided on the indicator substrate support 170, and an efficiency of radiating the heat of the inverter substrate IV_PCB described below may be improved.

In some implementations, the case 125 may include the lower plate LPA and the side plate SPA and the first blowing fan 240 and the second blowing fan 250 may be installed on the lower plate LPA.

Inlets IP1 and IP2 and the exhaust slits DS1, DS2, and DS3 may be defined in a portion of area of the lower plate LPA of the case 125.

In some implementations, a pair of inlets IP1 and IP2 and a pair of exhaust slits DS1, DS2, and DS3 may be provided and the pair of inlets IP1 and IP2 and the pair of exhaust slits DS1 and DS2 may be bilaterally symmetrical with respect to the center line CL across the lower plate LPA. That is, each of the pair of inlets IP1 and IP2 may be spaced apart from the center line by an equal distance in a horizontal direction. In some examples, the third exhaust slit DS3 may not be bilaterally symmetrical. For example, the third exhaust slit DS3 may include one exhaust slit disposed closer to the center line CL than another exhaust slit. The first inlet IP1 and the second inlet IP2, the first exhaust slit DS1 to the third exhaust slit DS3 are described below.

Specifically, the inlet may include a first inlet IP1 defined in a first area of the lower plate LPA that overlaps with the first blowing fan 240, and a second inlet IP2 defined in a second area of the lower plate LPA that overlaps with the second blowing fan 250.

The first inlet IP1 may be defined in consideration of a size of the first blowing fan 240. The second inlet IP2 may be defined in consideration of a size of the second blowing fan 250.

Further, the exhaust slit may include a first exhaust slit DS1 defined in the third area of the lower plate LPA, where the third area is placed at an opposite side of the first area (i.e., an area where the first inlet IP1 is defined) and the inverter substrate IV_PCB is placed between the first area and the third area, a second exhaust slit DS2 defined in a fourth area of the lower plate LPA placed at an opposite side of the second area (i.e., the area where the second inlet IP2 is defined), where the fourth area is placed at an opposite side of the second area and the resonance substrate R_PCB is provided between the second area and the fourth area, and a third exhaust slit DS3 defined in a fifth area of the lower plate LPA, where the fifth area is placed between the rear fence RF and the supporting guide SG.

In some implementations, as described above, the first blowing fan 240 and the second blowing fan 250 may be installed on the lower plate LPA of the case 125.

In some implementations, a pair of first blowing fans 240 and a pair of second blowing fans 250 may be provided, and the pair of first blowing fans 240 and the pair of second blowing fans 250 may be bilaterally symmetrical with respect to the center line CL across the lower plate LPA. A first blowing fan 240 and a second blowing fan 250 are described below.

Specifically, the first blowing fan 240 may be installed on the lower plate LPA (i.e., the above-described first area) and may suction the outside air through the first inlet IP1 and may discharge the air to the inverter substrate IV_PCB.

More specifically, some of the air discharged from the first blowing fan 240 to the inverter substrate IV_PCB is guided to the rear fence RF through the inverter IV and the first heat sink HS1. The remaining of the air discharged from the first blowing fan 240 to the inverter substrate IV_PCB may be guided to the rear fence RF by the one side fence LSF and the supporting guide SG. Further, the air guided to the rear fence RF may be discharged below the lower plate LPA (i.e., outside of the case 125) through the first exhaust slit DS1.

That is, the heat generated by the inverter IV during blowing of the first blowing fan 240 may be guided to the rear fence RF without being leaking to another place through the one side fence LSF and the supporting guide SG. Further, the heat guided to the rear fence RF may be transmitted to the first exhaust slit DS1 through the first portion RF1 of the rear fence RF that obliquely extends, and subsequently, the heat may be discharged to below the lower plate LPA (i.e., below the product (the induction heating device 1).

As described above, as heat generated by the inverter substrate IV_PCB is smoothly discharged below the lower plate LPA, so that the heating of the inverter substrate IV_PCB, in particular, the inverter IV may be resolved. That is, the temperature of the inverter IV may be reduced due to the air discharged by the first blowing fan 240 into the inverter substrate IV_PCB.

In some examples, the heat may be discharged below the product due to a distance between the space and the storage space.

That is, as shown in FIG. 13, when the induction heating device 1 is installed in the storage space 500, a distance DT between the side surface of the induction heating device 1 and the side surface of the storage space 500 may be less. The heat may be difficult to be discharged to the outside smoothly through the side surface of the induction heating device 1. Accordingly, a flow path to discharge the heat is defined so that the heat is discharged below the induction heating device 1 that defines an available space (i.e., a space between the lower side of the induction heating device 1 and a bottom of the storage space 500).

In some implementations, the second blowing fan 250 may be installed on the lower plate LPA (i.e., the above-mentioned second area), and may suction outside air through the second inlet IP2, and may discharge the air to the resonance substrate R_PCB.

More specifically, the air discharged from the second blowing fan 250 to the resonance substrate R_PCB may be guided to the rear fence RF through the resonance capacitor RC and the second heat sink HS2. Further, the air guided to the rear fence RF may be discharged below the lower plate LPA (i.e., outside of the case 125) through the second slit DS2 and third exhaust slit DS3.

That is, the heat guided to the rear fence RF stops moving at the second portion RF2 of the rear fence RF, and subsequently, the heat may be discharged below the lower plate LPA (i.e., below the product (the induction heating device 1) through the second exhaust slit DS2 and the third exhaust slit DS3.

As described above, as heat generated by the resonance substrate R_PCB is smoothly discharged below the lower plate LPA, it is possible to resolve the heating of the resonance substrate R_PCB, in particular, the resonance capacitor RC. That is, the temperature of the resonance capacitor RC may be reduced due to the air discharged from the second blowing fan 250 to the resonance substrate R_PCB.

FIGS. 14 and 15 respectively show an example of heat flow generated when the induction heating device 1 is driven.

Referring to FIG. 14, when a first blowing fan 240 is driven, heat generated by an inverter substrate IV_PCB is also transferred to an area without the first heat sink HS1. However, through the above-described one side fence LSF (see FIG. 7) and the supporting guide SG (see FIG. 7), the heat may not be transferred to another component or substrate, and the first portion RF1 (see FIG. 7) of the rear fence RF may be guided.

In some examples, when the second blowing fan 250 is driven, most of the heat generated by the resonance substrate R_PCB is transferred along the second heat sink HS2, an additional supporting guide is not provided on the resonance substrate R_PCB.

Referring to FIG. 15, air (i.e., the heat) discharged by the first blowing fan 240 and guided to the rear fence RF (see FIG. 7) may be discharged below the lower plate LPA along the first portion RF1 of the rear fence RF that obliquely extends.

Thus, in the induction heating device 1, the temperature of the inverter substrate IV_PCB and the temperature of the resonance substrate R_PCB may be controlled without an additional injection component based on the above-mentioned cooling structure (i.e., the structure of the indicator substrate support 170, the inlets IP1 and IP2 and the exhaust slits DS1 to DS3 defined in the case 125, the position of the resonance substrate R_PCB and the position of the inverter substrate IV_PCB, and the positions of the first blowing fan 240 and the second blowing fan 250).

As described above, according to the implementation of the present disclosure, the induction heating device 1 may control the temperature of the inverter substrate and the temperature of the resonance substrate without the additional injection component, thereby resolving heating of the inverter substrate and the resonance substrate, and reducing the manufacturing cost thereof and the height of the product Further, the reliability in component and performance of the product may be provided by resolving the heating of the inverter substrate and the resonance substrate and the compact product may be manufactured by reducing the height of the product.

Further, according to an implementation of the present disclosure, the induction heating device 1 may control the temperature of the working coil and the indicator, thereby resolving the heating of the working coil and the indicator. Furthermore, even when all indicators are provided on four surfaces of the high-power working coil, the temperature of the working coil and the temperature of the indicator may be controlled, thereby maintaining an output performance of the working coil and a light emitting performance of the indicator, as well as resolving the heating. Further, the possibility in that the indicator is damaged due to the heating of the working coil may be minimized, thereby improving a lifespan of the product and providing the reliability in the product.

While the present disclosure has been described with reference to exemplary drawings thereof, it is to be understood that the present disclosure is not limited to implementations and drawings in the present disclosure, and various changes can be made by the skilled person in the art within the scope of the technical idea of the present disclosure. Although working effects obtained based on configurations of the present disclosure are not explicitly described while describing the implementations of the present disclosure, effects predictable based on the configurations have also to be recognized.

What is claimed is:

1. An induction heating device, comprising:
a case comprising a lower plate and a side plate that extends upward along an edge of the lower plate, the lower plate defining an inlet and an exhaust slit;
a cover plate coupled to the side plate and configured to seat an object on an upper surface of the cover plate;
a working coil disposed inside the case and configured to heat the object;
an indicator substrate support coupled to the lower plate and disposed vertically below the working coil;
an inverter substrate disposed on a lower surface of the indicator substrate support, the inverter substrate comprising (i) an inverter configured to apply a resonance current to the working coil through a switching operation and (ii) a first heat sink configured to dissipate heat generated from the inverter; and
a first blowing fan disposed at the lower plate and configured to draw air from an outside of the case through the inlet and discharge the air to the inverter substrate,
wherein the exhaust slit is configured to discharge, to an area below the lower plate, at least a portion of air discharged from the first blowing fan to the inverter substrate.

2. The induction heating device of claim 1, wherein the indicator substrate support comprises:
a lower fence disposed on the lower surface of the indicator substrate support, the lower fence comprising a front fence, a rear fence, a first side fence, and a second side fence that are arranged along an edge of the lower surface of the indicator substrate support; and
a supporting guide disposed on the lower surface of the indicator substrate support and spaced apart from the first side fence, and
wherein the inverter substrate is disposed between the first side fence and the supporting guide.

3. The induction heating device of claim 2, wherein each of the front fence, the first side fence, and the second side fence extends downward from the lower surface of the indicator substrate support and defines a right angle with respect to the lower surface of the indicator substrate support, and
wherein the rear fence comprises:
a first portion that extends from the lower surface of the indicator substrate support and that defines an obtuse angle with respect to the lower surface of the indicator substrate support; and
a second portion that extends downward from the lower surface of the indicator substrate support and that defines the right angle with respect to the lower surface of the indicator substrate support.

4. The induction heating device of claim 3, further comprising an input interface that is flush with an upper surface of the cover plate and that is configured to display one or more images,
wherein the second portion of the rear fence extends downward from the lower surface of the indicator substrate support along an edge of the input interface.

5. The induction heating device of claim 3, wherein the rear fence is configured to:
receive a first portion of air that is discharged from the first blowing fan to the inverter substrate and that is guided through the inverter and the first heat sink; and
receive a second portion of air that is discharged from the first blowing fan to the inverter substrate and that is guided by the first side fence and the supporting guide, and
wherein the exhaust slit is configured to discharge, to the area below the lower plate, the first portion of air and the second portion of air that are guided to the rear fence.

6. The induction heating device of claim 3, wherein the second portion of the rear fence is recessed inward toward the front fence.

7. The induction heating device of claim 2, further comprising:
a resonance substrate disposed on the lower surface of the indicator substrate support, the resonance substrate comprising (i) a resonance capacitor connected to the working coil and configured to generate resonance of the working coil based on the switching operation of the inverter and (ii) a second heat sink configured to dissipate heat generated by the resonance capacitor; and
a second blowing fan disposed at the lower plate and configured to draw air from the outside of the case through the inlet and discharge the air to the resonance substrate,
wherein the exhaust slit is configured to discharge, to the area below the lower plate, at least a portion of air discharged from the second blowing fan to the resonance substrate.

8. The induction heating device of claim 7, wherein the inlet comprises:
a first inlet defined in a first area of the lower plate that overlaps with the first blowing fan; and
a second inlet defined in a second area of the lower plate that overlaps with the second blowing fan, and
wherein the exhaust slit comprises:
a first exhaust slit defined in a third area of the lower plate, wherein the third area is spaced apart from the first area, and the inverter substrate is disposed between the first area and the third area of the lower plate, a second exhaust slit defined in a fourth area of the lower plate, wherein the fourth area is spaced apart from the second area, and the resonance substrate is disposed between the second area and the fourth area of the lower plate, and a third exhaust slit defined in a fifth area of the lower plate, wherein the fifth area is disposed between the rear fence and the supporting guide.

9. The induction heating device of claim 7, wherein the resonance substrate is disposed at a center area of the lower surface of the indicator substrate support between the front fence and the rear fence, and wherein the inverter substrate is disposed at one side of the resonance substrate adjacent to the first side fence and the rear fence.

10. The induction heating device of claim 7, wherein the first blowing fan is configured to decrease a temperature of the inverter by blowing air to the inverter substrate, and wherein the second blowing fan is configured to decrease a temperature of the resonance capacitor by blowing air to the resonance substrate.

11. The induction heating device of claim 2, wherein the inverter is disposed between the supporting guide and the first heat sink.

12. The induction heating device of claim 1, further comprising a mica sheet disposed between the inverter substrate and the lower plate and configured to provide insulation between the inverter substrate and the lower plate.

13. The induction heating device of claim 12, wherein the mica sheet has a first side surface that is attached to the lower plate by a sealant and a second side surface that contacts the first heat sink.

14. The induction heating device of claim 12, wherein at least one of the lower plate or the side plate defines an inlet slit spaced apart from the inlet and an additional exhaust slit spaced apart from the exhaust slit.

15. The induction heating device of claim 14, further comprising:

a base plate, the working coil being disposed on an upper surface of the base plate;

an indicator substrate disposed on an upper surface of the indicator substrate support and disposed vertically below the base plate, the indicator substrate comprising a plurality of light emitting elements; and a third blowing fan disposed at a lower surface of the base plate and configured to draw air from the outside of the case through the inlet slit and discharge the air to an air flow path defined between the base plate and the indicator substrate, wherein the additional exhaust slit is configured to discharge, to the outside of the case, air discharged from the third blowing fan to the air flow path.

16. The induction heating device of claim 15, wherein the indicator substrate support comprises an upper fence that extends along an edge of the upper surface of the indicator substrate support, and wherein the air flow path is surrounded by the lower surface of the base plate, the upper surface of the indicator substrate, and the upper fence.

17. The induction heating device of claim 15, wherein the base plate is made of aluminum (Al).

18. The induction heating device of claim 15, wherein the third blowing fan is configured to decrease a temperature of the plurality of light emitting elements by blowing air to the air flow path.

19. The induction heating device of claim 15, further comprising:

a light guide disposed on the base plate around the working coil, the light guide comprising a light emitting surface configured to indicate (i) whether the working coil is driven and (ii) an output intensity of the working coil;

a ferrite core disposed on the base plate vertically below the working coil and configured to diffuse an alternating magnetic field generated by the working coil; and an additional mica sheet disposed between the working coil and the ferrite core and configured to block heat transfer from the working coil to the ferrite core, wherein the plurality of light emitting elements are disposed vertically below the light guide and configured to emit light to the light guide.

20. The induction heating device of claim 1, wherein each of the inverter and the first heat sink is attached to a lower surface of the inverter substrate, and wherein the lower surface of the inverter substrate and the lower plate define an air passage therebetween configured to guide air discharged from the first blow fan to the exhaust slit.

* * * * *